United States Patent [19]

Callahan, Jr.

[11] 3,878,551

[45] Apr. 15, 1975

[54] SEMICONDUCTOR INTEGRATED CIRCUITS HAVING IMPROVED ELECTRICAL ISOLATION CHARACTERISTICS

[75] Inventor: Michael J. Callahan, Jr., Tucson, Ariz.

[73] Assignee: Texas Instruments Incorporated, Dallas, Tex.

[22] Filed: Nov. 30, 1971

[21] Appl. No.: 203,353

[52] U.S. Cl. .................... 357/48

[51] Int. Cl. .................... H01l 19/00

[58] Field of Search ..... 317/101 A, 235 E, 235 UA, 317/235 Y

[56] References Cited

UNITED STATES PATENTS

| | | | |
|---|---|---|---|
| 3,341,755 | 9/1967 | Husher et al. | 317/235 E |
| 3,370,995 | 2/1968 | Lowery et al. | 317/235 E |
| 3,443,174 | 5/1969 | Busen et al. | 317/235 Y |
| 3,470,390 | 9/1969 | Chan Lin | 317/235 G |
| 3,502,951 | 3/1970 | Hunts | 317/235 E |
| 3,517,280 | 6/1970 | Rosier | 317/235 UA |
| 3,524,113 | 8/1970 | Agusta et al. | 317/235 E |
| 3,551,761 | 12/1970 | Ruoff | 317/235 E |
| 3,649,883 | 3/1972 | Augustine | 317/235 UA |

OTHER PUBLICATIONS

Watson, G. F., "Bell Bipolar Process Ready to Go," Electronics, August 31, 1970, pp. 87–88.

*Primary Examiner*—David Smith, Jr.
*Attorney, Agent, or Firm*—Harold Levine; James T. Comfort; Gary C. Honeycutt

[57] ABSTRACT

Semiconductor integrated circuits having improved electrical isolation characteristics include a monocrystalline semiconductor substrate and a layer of epitaxial semiconductor material overlying at least a portion of one major surface of the substrate with a relatively heavily doped region interposed between at least a portion of the epitaxial layer and the one major surface of the substrate and extending into a portion of the one major surface of the substrate. At least one p-n junction is formed in a portion of the epitaxial layer overlying the interposed heavily doped region. As isolation region of a preselected conductivity type extends from an exposed face of the epitaxial layer into the heavily doped interposed region but remains spaced from the substrate by a portion of the interposed region. The isolation region electrically isolates the p-n junction from the substrate.

20 Claims, 12 Drawing Figures

SEMICONDUCTOR INTEGRATED CIRCUITS HAVING IMPROVED ELECTRICAL ISOLATION CHARACTERISTICS

The present invention relates generally to semiconductor devices and integrated circuits, and more particularly is directed to semiconductor devices and integrated circuits having improved electrical isolation characteristics.

A wide variety of semiconductor integrated circuits are currently available in which a plurality of circuit elements are formed in a common body of semiconductor material, with the various circuit elements being suitably arranged to define desired circuit functions. In certain instances it is quite desirable to maintain certain of the circuit elements electrically isolated from one another within the common body of semiconductor material, as well as from various portions of the semiconductor material itself in order to avoid undesired electrical interactions. The provision of such electrical isolation has been somewhat complicated particularly in recent years due in part to the relatively common practice of forming such semiconductor integrated circuits by epitaxially depositing a layer of semiconductor material on a substrate of semiconductor material and then providing an interposed region of heavily doped material intermediate a portion of the epitaxial layer and the surface of the semiconductor substrate extending partially into the surface of the semiconductor substrate and partially into the contiguous surface of the epitaxial layer. The desired circuit elements are then formed in the epitaxial layer. In such structures the provision of the requisite electrical isolation may become somewhat more difficult to achieve due to the existence of current paths between circuit elements through the epitaxial layer as well as current paths which flow between such circuit elements and the substrate. The latter type of current paths may result in parasitic substrate current and in certain instances may adversely affect the operating characteristics of the individual circuit elements and the functional semiconductor integrated circuit. The problem of parasitic substrate current may become particularly significant when a semiconductor integrated circuit such as a linear integrated circuit is provided, since in some instances the transistor circuit elements which are formed in the semiconductor body tend to operate in their saturation region. For example, when an n-p-n transistor is formed in the epitaxial layer and operated in its saturation region a parasitic p-n-p transistor may be formed with the substrate functioning as the collector. Several techniques have been proposed for eliminating such parasitic action but have met with somewhat limited success. One such technique involves introducing gold impurities into the epitaxial layer in order to reduce minority carrier lifetime by encouraging these minority carriers to recombine in the base region of the parasitic transistors. As a result very few carrier are able to reach the substrate and parasitic transistor action is substantially reduced. However, as a consequence of such gold doping the reduction in minority carrier lifetime may effect a reduction in the useful operation of various types of transistor structures making this procedure unsuitable in many instances and particularly in instances in which it is desired to provide linear integrated circuits. Another technique which has been proposed comprises the diffusion of relatively deep collector regions in order to form a barrier against parasitic action but such a procedure requires additional diffusion and mask alignment steps during the fabrication procedure and thus is economically prohibitive in many instances. Other proposals involve the formation of regions of dielectric isolation surrounding certain of the circuit elements formed in the semiconductor device and such proposals have met with success in some instances, but similarly may be economically unfeasible.

Accordingly, it is an object of the present invention to provide semiconductor deivces and integrated circuits having improved electrical isolation characteristics.

It is another object of the present invention to provide semiconductor integrated circuits in which interaction of circuit elements formed in a semiconductor body are substantially reduced.

It is a further object of the present invention to provide improved semiconductor integrated circuits in which parasitic current flow to the semiconductor substrate from circuit elements of the integrated circuit is substantially prevented.

It is another feature of the invention that ohmic contacts and ohmic contact enhancement regions may be formed outside of the perimeter of various isolation regions to provide electrical contact to various active regions of circuit elements formed within the perimeter of such isolation regions.

Various additional objects, advantages and features of the invention will become readily apparent from the following detailed description and claims, and from the accompanying drawings wherein:

Figure 3:
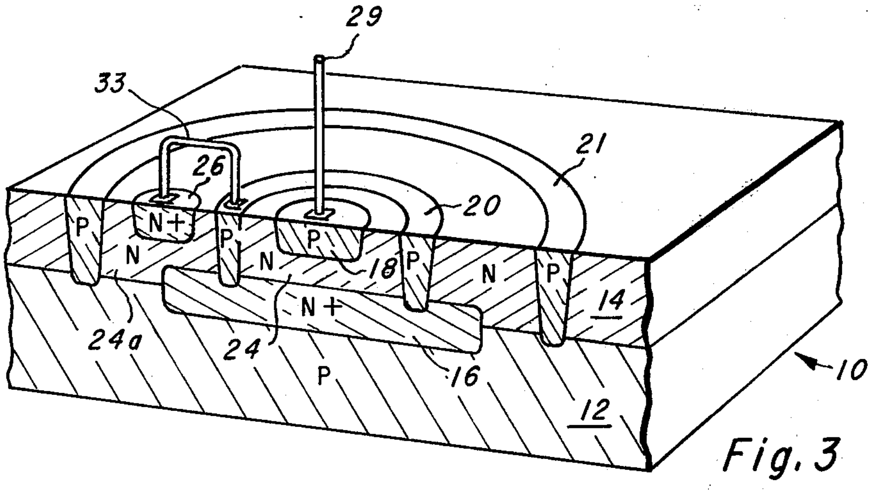
FIG. 3 is a partial perspective view through a vertical section of another embodiment of a semiconductor device or integrated circuit element in accordance with the present invention to provide an isolated p-n diode.
Figure 5:
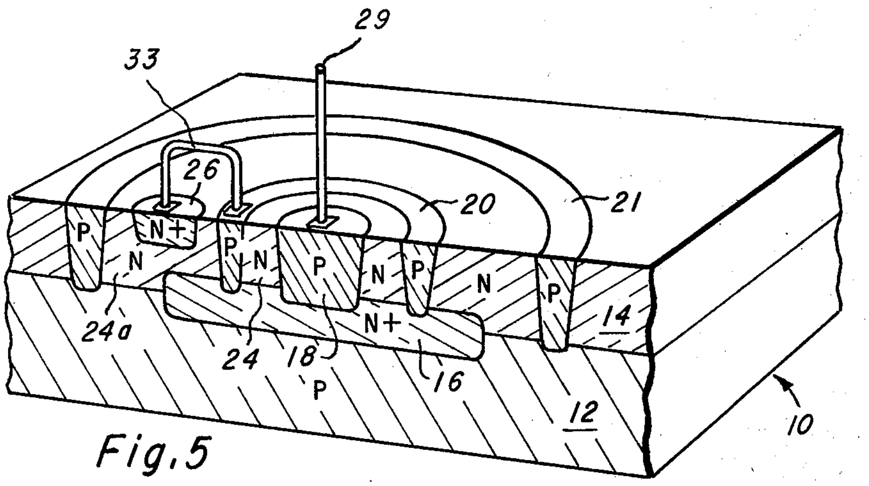
Figure 4:
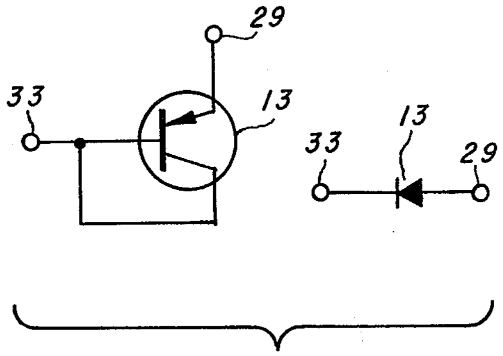
Figure 6:
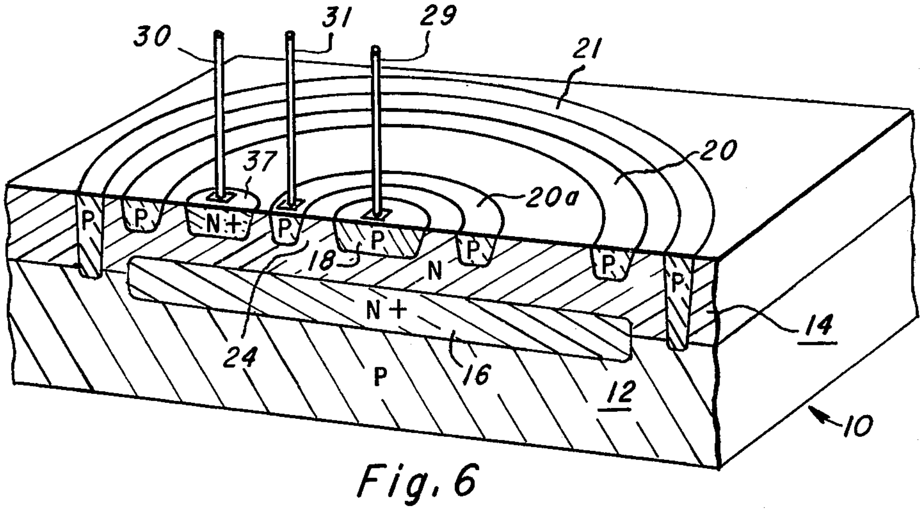
Figure 7:
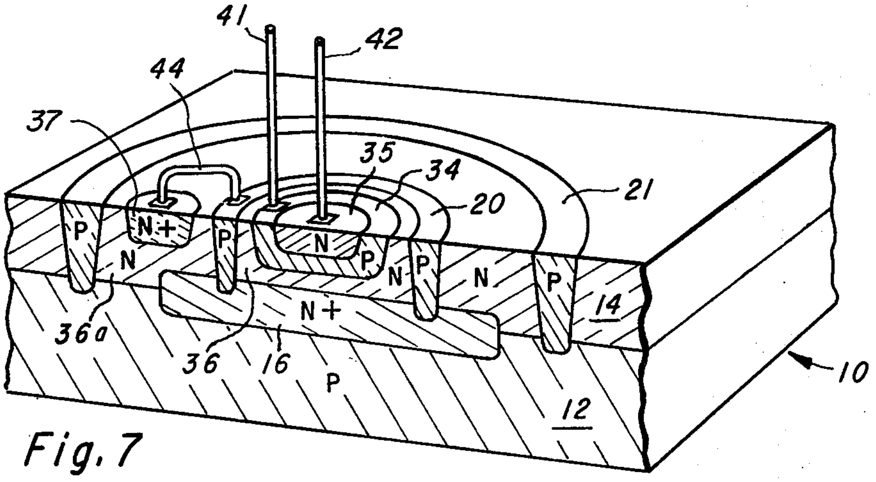
Figure 9:
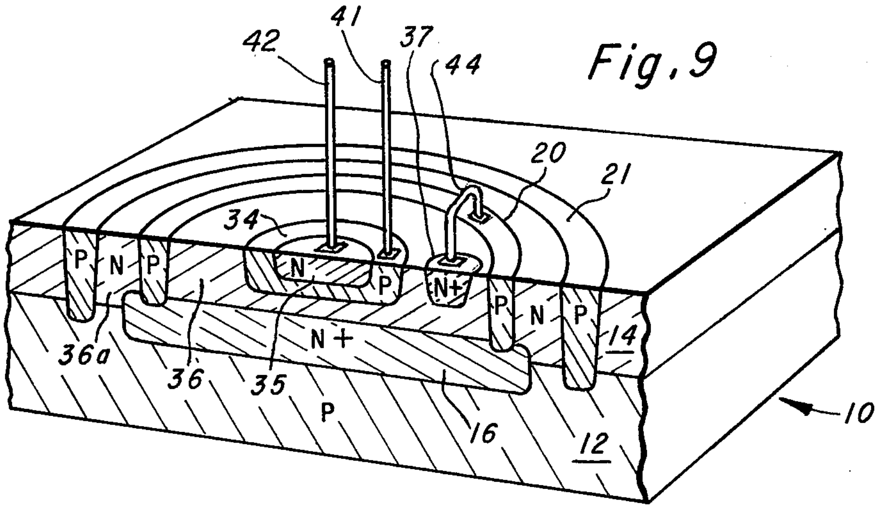
Figure 10:
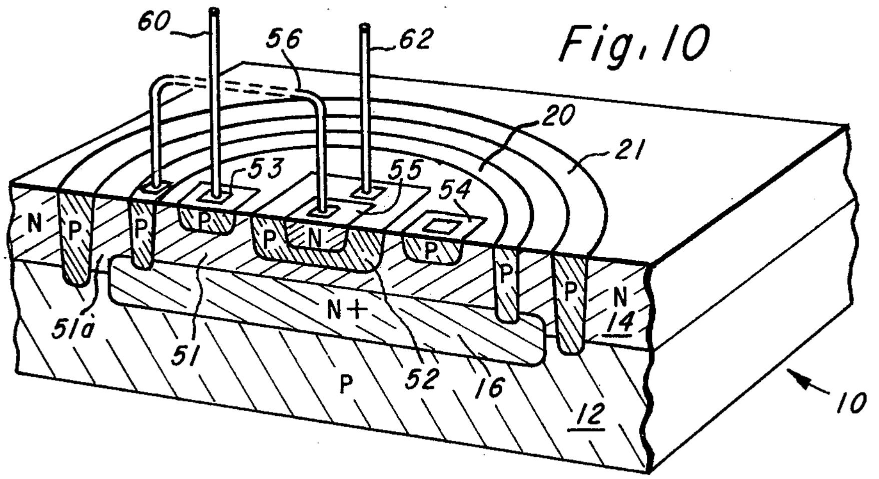
Figure 8:
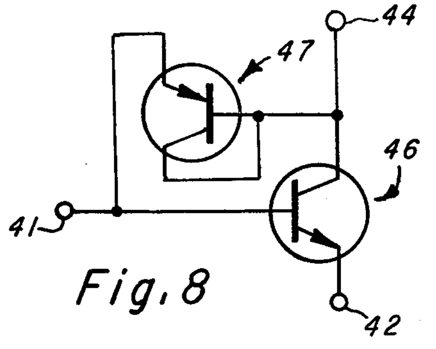
Figure 11:
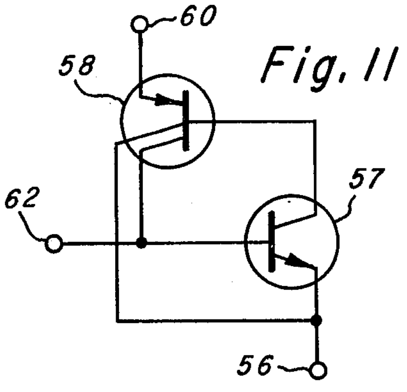
Figure 12:
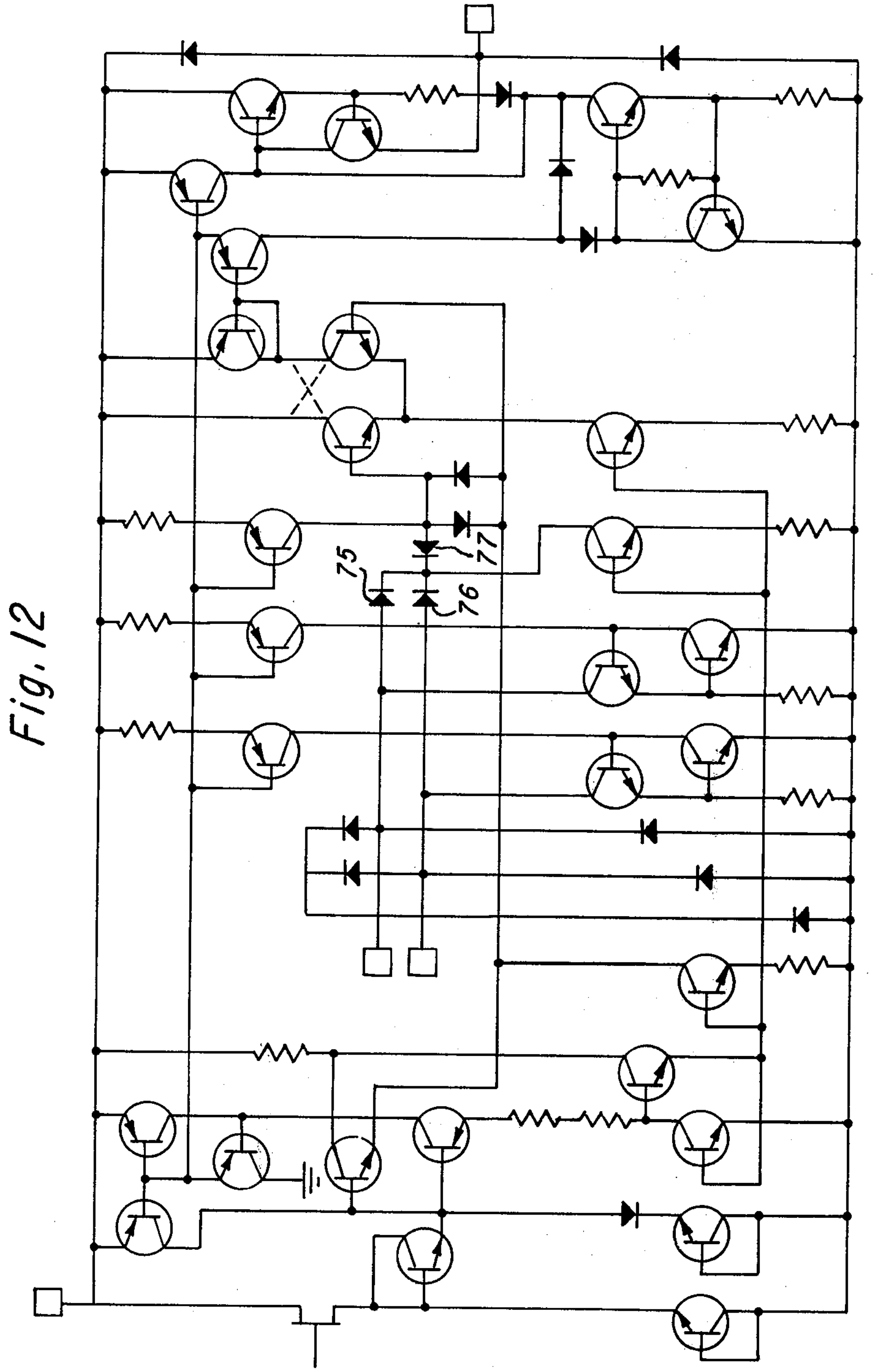

FIG. 4 comprises electrical schematic circit diagrams of the diode of FIG. 3;

FIG. 5 is a partial perspective view through a vertical section of a device of integrated circuit element in accordance with the present invention to provide an isolated p-n diode;

FIG. 6 is a partial perspective view through a vertical section of a device or integrated circuit element in accordance with the present invention to provide an isolated p-n-p transistor;

FIG. 7 is a partial perspective view through a vertical section of a further embodiment of a device or integrated circuit element in accordance with the invention to provide an isolated n-p-n transistor;

FIG. 8 is an electrical schematic diagram of the transistor of FIG. 7;

FIG. 9 is a partial perspective view through a vertical cross-section of still another embodiment of a device or integrated circuit element in accordance with the present invention to provide an isolated n-p-n transistor;

FIG. 10 is a partial perspective view through a vertical section of yet another embodiment of interconnected integrated circuit elements in accordance with the present invention to provide controlled rectifiers;

FIG. 11 is an electrical circuit diagram of the circuit elements of FIG. 10; and FIG. 12 is an electrical schematic diagram of a quad two-input NAND gate integrated circuit employing isolated circuit elements in accordance with the present invention.

Figure 1:
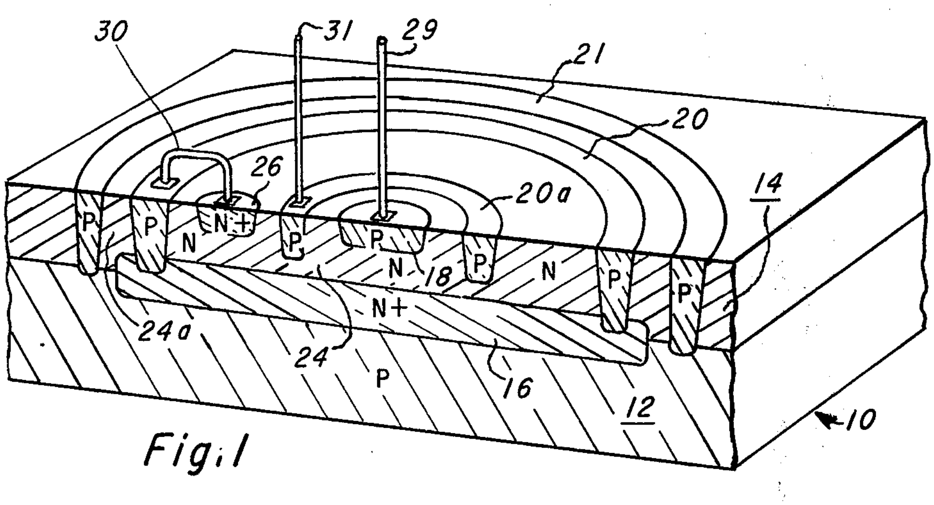
FIG. 1 is a partial perspective view through a vertical section of one embodiment of a semicoductor device or integrated circuit element in accordance with the present invention to provide an isolated p-n-p transistor.

Referring generally to the drawings and initially to FIG. 1, a semiconductor device or integrated circuit 10 is illustrated including a monocrystalline semiconductor substrate 12 having an epitaxial layer 14 of semiconductor material deposited on one major surface thereof, overlying at least a portion of such surface, while a heavily doped region 16 is formed in the epitaxial layer interposed between at least a portion of the one face of the substrate and the epitaxial layer, the interposed region 16 extending into a portion of the one surface of substrate 12. In addition, at least one region 18 is formed in a portion of epitaxial layer 14 overlying the interposed region 16 to provide a p-n junction and an isolation region 20 of a preselected conductivity type extends from an exposed surface of the epitaxial layer 14 into the heavily doped interposed region 16 for electrically isolating the p-n junction from the substrate 12. The isolation region 20 extends into a portion of the interposed region 16, but is spaced from the substrate by a portion of the interposed region.

More particularly, the substrate 12 preferably comprises a monocrystalline semiconductor material, such as silicon, having a predetermined conductivity type and in the illustrated embodiment is of P-type material while the epitaxial layer 14 deposited thereon comprises an opposite conductivity type material and is illsutrated as N-type semiconductor material. The interposed region 16 commonly referred to as a buried layer is preferably formed by diffusing a suitable N-type dopant into the exposed surface of substrate 12 under suitable conditions of time, temperature, etc. such that the region 16 extends into the substrate but terminates in spaced relationship from the opposite face thereof, as shown, prior to the forming of epitaxial layer 14. The interposed region 16 is preferably relatively heavily doped and is accordingly designated as an N+ region, and functions to enhance the electrical characteristics of circuit elements which are to be formed in the overlying epitaxial layer. In this regard region 18 may be formed utilizing conventional diffusion techniques, such as by diffusing a P-type dopant into the exposed surface of the epitaxial layer 14 through a suitable mask forming a P-type region 18 which cooperates with the surrounding N-type material of the epitaxial layer 14 to define the desired p-n junction. In the embodiment illustrated in FIG. 1 an additional P-type region 20*a* is formed at the same time region 18 is formed to provide a collector region for a p-n-p transistor.

In accordance with an important feature of the present invention the isolation region 20 is provided and arranged to circumscribe a preselected portion 24 of the epitaxial layer 14 extending from the exposed surface thereof into the interposed region 16, as shown. In order to provide the requisite electrical isolation the isolation region 20 is of an opposite conductivity type with respect to the epitaxial layer 14 and accordingly comprises P-type material. The P-type region 20 may be formed by diffusion and extends to the N+ interposed region 16 where it terminates spaced from the portion of the P-type substrate 12 which underlies the interposed region.

The region 20 may be of a desired geometric configuration, such as elliptical, rectangular, etc., but is illustrated as being generally circular for the sake of convenience.

The P-type regions 18 and 20*a*, and the associated p-n junctions with N-type epitaxial layer 14 are disposed within the circumscribed portion 24 and thus are completely electrically isolated from the substrate 12 both by the P-type isolation region 20 which prevents lateral flow of charge carriers to the substrate, as well as by the N+ interposed region 16 which is of opposite conductivity type with respect to the substrate 12. Accordingly, any flow of charge carriers from the P-type region 18 tend to recombine within the circumscribed portion 24 of the N-type epitaxial layer 14 or within the N+ interposed region, or are captured in the P-type isolation region 20 and reinjected into region 24 by conductor 30 so that substantially complete electrical isolation of the P-type region 18 and the p-n-p transistor thus provided is effected. The p-n-p transistor is defined by P-type (emitter) region 18, N-type epitaxial (base) region 24 and P-type (collector) region 20*a*.

A further feature of the invention is that region 24*a* of epitaxial layer 14 additionally provides a convenient means for connection to base region 24 since it is in common with region 24 through the low resistivity of N+ region 16. Therefore, contact to the base region may be made to region 24*a*. An N+ ohmic contact enhancement zone 26 extending from the exposed surface of epitaxial layer 14 is provided in region 24*a* for base contact 30 such that base current flows through the path provided by N-type regions 24, 16, 24*a* and 26. In order to provide complete isolation of the p-n-p transistor thus provided, an additional P-type isolation region 21 is formed by diffusion or the like extending from the exposed surface of epitaxial layer 14 into the substrate 12 exteiorly of the interposed region 16 of isolation region 20 and the various regions of the p-n-p transistor structure. Isolation region 21 may be formed at the same time and in a similar manner to region 20 as region 20 will stop diffusing when it has reached region 16. The resulting transistor device or integrated circuit element has many advantages. As previously mentioned, a most important advantage is that complete isolation between the transistor and other circuit elements formed within epitaxial layer 14 and between the transistor and the substrate is provided which is particularly desirable when fabricating linear integrated circuits which include transistors operated in their saturation region. Furthermore, the transistor provides high breakdown voltages ($BV_{EBO}$,$BV_{CBO}$ and $BV_{CEO}$) and a high gain $h_{FE}$ as a result of the more complete capture of emitted holes.

Figure 2:
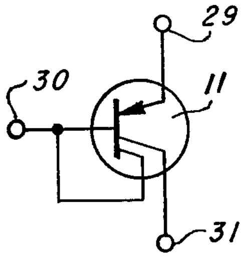
FIG. 2 is an electrical schematic circuit diagram of the transistor of FIG. 1.

The resultant equivalent transistor circuit is illustrated in FIG. 2 wherein the transistor is indicated generally by the reference numeral 11 and includes base terminal 30, emitter terminal 29 and collector terminal 31.

Referring to FIG. 3, a p-n diode is provided in accordance with an embodiment of the invention in a similar structure to that of FIG. 1. Since the current path from base region 24 extends through low resistivity region 16 to region 24*a*, the base contact may be made to region 24*a* or to ohmic contact enhancement zone 26 in region 24*a*, as shown. The resultant equivalent diode circuit is illustrated in FIG. 4 wherein the diode is indicated generally by the reference numeral 13 and includes terminals 29 and 33.

Another embodiment of the invention, illustrated in FIG. 5, includes a p-n diode and is similar to the structure embodied in FIG. 3 with the exception that region 18 which provides an active diode region extends into heavily doped interposed region 16. The advantage of this embodiment is that region 18 is formed simultaneously with regions 20 and 21 at the same temperature and for the same time thereby simplifying the fabrication process. This same principle may be applied to emitter region 18 of the transistor of FIG. 2. In the embodiment of FIG. 6, which is similar to the embodiment of FIG. 1, isolation region 20 is not driven down into interposed region 16. The shallow region 20 still provides reduction of substrate current because carriers recombine at region 20 due to the relative proximity of region 20 and due to the aiding electric fields produced by the device or circuit element. This structure has the additional advantage of being smaller than the structure of FIG. 1, for example, although its efficiency is not as great as the embodiment of FIG. 1. The shallow isolation region is also applicable to the diode structure of FIG. 3.

N-p diodes and n-p-n transistors may be provided by reversing the conductivity types in the structures of FIGS. 1, 3, 5 or 6. In most integrated circuit applications, however, it is desirable to utilize a P-type substrate 12. In accordance with another embodiment of the invention, an isolated n-p-n structure is provided on a P-type substrate as illsutrated in FIG. 7. Referring to FIG. 7, a semiconductor device or integrated circuit 10 is illustrated including a monocrystalline semiconductor substrate 12 having an epitaxial layer 14 of semiconductor material deposited on one major surface thereof, overlying at least a portion of such surface, while a heavily doped region 16 is formed in the epitaxial layer interposed between at least a portin of the one face of the substrate and the epitaxial layer, the interposed region 16 extending into a portion of the one surface of substrate 12. In addition, a first active region 34 is formed in a portion of epitaxial layer 14 overlying the interposed region 16 to provide a p-n junction and a second p-n junction is provided by forming a second active region 35 within the first active region 34. An isolation region 20 of a preselected conductivity type extends from an exposed surface of the epitaxial layer 14 into the heavily doped interposed region 16 for electrically isolating the p-n junctions from the substrate 12. The isolation region 20 extends into a portion of the interposed region 16, but is spaced from the substrate by a portion of the interposed region.

More particularly, the substrate 12 preferably comprises a monocrystalline semiconductor material, such as silicon, having a predetermined conductivity type and in the illustrated embodiment of P-type material while the epitaxial layer 14 deposited thereon comprises opposite conductivity type material and is illustrated as N-type semiconductor material. The interposed region 16 is preferably formed by diffusing a suitable N-type dopant into the exposed surface of the substrate 12 under suitable conditions of time, temperature, etc. prior to the formation of the epitaxial layer 14, such that the region 16 extends into the substrate but terminates in spaced relation from the opposite face thereof, as shown. The interposed region 16 is preferably relatively heavily doped and is accordingly designated as an N+ region, and functions to enhance the electrical characteristics of circuit elements which are to be formed in the overlying epitaxial layer. In this regard active region 34 may be formed by utilizing conventional diffusion techniques, such as by diffusing a P-type dopant into the exposed surface of the epitaxial layer 14 through a suitable mask forming a P-type region 34 which cooperates with the surrounding N-type material of the epitaxial layer 14 to define the desired p-n junction. The second active region 35 may also be formed utilizing conventional diffusion techniques, such as by diffusing an N-type dopant into the exposed surface of the first region 34 of P-type material to define the desired n-p junction.

In accordance with the present invention, the isolation region 20 is provided and arranged to circumscribe a preselected portion 36 of the epitaxial layer 14 extending from the exposed surface thereof into the interposed region 16, as shown. In order to provide the requisite electrical isolation the isolation region 20 is of opposite conductivity type with respect to the epitaxial layer 14 and accordingly comprises P-type material. The P-type region 20 may be formed by diffusion and extends to the N+ interposed region 16, where it terminates spaced from the portion of the P-type substrate 12 which underlies the interposed region. Again, the region 20 may be of a desired geometric configuration, such as elliptical, rectangular, etc., but is illustrated as being generally circular for the sake of convenience.

The n-type region 35, P-type region 34 and the associated p-n junction with N-type epitaxial layer 14 are disposed within the circumscribed portion 36. The n-p-n transistor provided is thereby completely electrically isolated from the substrate 12 both by the P-type isolation region 20 which prevents lateral flow of charge carriers to the substrate, as well as by the N+ interposed region 16 which is of opposite conductivity type with respect to the substrate 12. Accordingly any flow of charge carriers from the P-type region 34 tend to recombine with the circumscribed portion 36 of the N-type epitaxial layer 14 or with the N+ interposed region, or are captured in the P-type isolatiion region 20 and reinjected into region 36 so that substantially complete electrical isolation of the n-p-n transistor is effected. The resulting structure is an isolated n-p-n transistor defined by N-type (emitter) region 35, P-type (base) region 34 and N-type epitaxial (collector) region 36. Another feature of the invention is that region **36*a* of epitaxial layer 14 additionally acts as means for contacting collector region 36 since it is in common with region 36 through the low resistivity path provided by N+ region 16. Therefore, contact to the collector region may be made to region 36*a*. An N+ ohmic contact enhancement zone 37 extending from the exposed surface of epitaxial layer 14 may be provided in region 36*a* for a collector contact such that collector current flows through the path provided by N-type regions 36, 16, 36*a* and 37. In order to provide complete isolation of the n-p-n transistor thus provided, and in particular complete isolation of region 36*a*, an additional P-type isolation region 21 is formed by diffusion or the like, extending from the exposed surface of epitaxial layer 14 into the P-type substrate 12 exteriorly of the interposed region 16, of the P-type region 20, and of the various regions of the n-p-n transistor structure. The resulting transistor device or integrated circuit element has many advantages. As previously mentioned, a most important advantage is the complete isolation between the transistor and other circuit elements formed within epitaxial layer 14** and between the transistor and the substrate is provided which is particularly desirable when fabricating linear integrated circuits which include transistors operated in the saturation region. Furthermore, the transistor provides high breakdown voltages.

The resultant equivalent transistor circuit is illustrated in FIG. 8 wherein the n-p-n transistor is indicated generally by the reference numeral 46 and includes emitter terminal 42, base terminal 41 and collector terminal 44 and wherein the charge carriers collector by the collector of transistor 47 are reinjected into collector region 36 which is also the base region of transistor 47.

In the embodiments thus far illustrated, and in accordance with a feature of the invention, contact to the active epitaxial region within the perimeter of the isolation region 20 has been shown to be made to the epitaxial region outside of the perimeter of the isolation region 20. This feature is made possible because of the low resistivity path provided by interposed region 16. As previously mentioned, where desired, contact to the active epitaxial region within the perimeter of isolation region 20 can be made directly to such region. Consider, for example, the structure of FIG. 9 which is the electrical equivalent of the structure of FIG. 7. Notice, however, that the collector contact is made directly to region 36 in the embodiment of FIG. 9 while collector contact is made to region 36*a* in the embodiment of FIG. 7. Similarly, in the embodiments of FIGS. 1, 3, 5 and 6 ohmic contact may be made directly to region 24 rather than region 24*a*. An advantage in placing the ohmic contact outside the perimeter of isolation region 20 is that in most instances a smaller structure is achieved which provides for increased circuit density.

Referring now to FIGS. 10 and 11 another embodiment of a device illustrated generally by the reference numeral 10 is illustrated including several interconnected transistors functionally equivalent to a controlled rectifier, such as a silicon controlled rectifier, fabricated in a single body of semiconductor material in which various other circuit elements may also be fabricated electrically isolated therefrom. More particularly, in this embodiment a substate 12 comprising a monocrystalline semiconductor material of a predetermined conductivity type, illustrated as P-type material is again provided with an overlying epitaxial layer 14 of an opposite conductivity type material, i.e., N-type material, deposited thereon, and a heavily doped interposed region or buried layer 16 intermediate the epitaxial layer and one face of the substrate extending into the one face of the substate, as shown. A P-type isolation region 20 is provided extending from an exposed face of the epitaxial layer into the heavily doped interposed region 16 and being spaced from the substrate by a portion of the interposed layer. As shown, the P-type isolation region 20 may be of a generally circular configuration and is arranged to circumscribe a predetermined portion 51 of the epitaxial layer 14 in order to achieve the requisite electrical isolation of the circumscribed portion 51 from the substrate.

In order to define the function of a silicon controlled rectifier, a pair of transistors one of which is of the n-p-n type and the other of the p-n-p type are formed within the circumscribed portion. More particularly, a generally centrally located P-type region 52 is formed within the epitaxial layer 14 extending from an exposed surface thereof at a location approximately centrally within the circumscribed portion 51. In addition, a pair of P-type regions 53 and 54 are also formed in the epitaxial layer 14 on opposite sides of the region 52 extending from the exposed surface of the epitaxial layer spaced apart from the central P-type region 52 as well as from the P-type isolation region 20. an N-type region 55 is formed generally centrally within the central P-type region extending from the exposed surface of the epitaxial layer 14, as shown, and is externally electrically connected to the P-type isolation region 20 by a conductor 56. In addition, a surrounding P-type isolation region 21 is preferably provided, and is spaced from the P-type isolation layer 20 by region 51*a* of epitaxial layer 14 and from the interposed region 16. The P-type region 21 extends from the exposed surface of the epitaxial layer into the substrate to provide additional electrical isolation and in particular from other portions of the epitaxial layers external to the circumscribed portion. Referring to FIG. 11 a pair of interconnected transistors are illustrated including an n-p-n transistor 57 and a p-n-p transitor 58 which are schematically representative of the circuit elements formed in the semiconductor device 10 illustrated in FIG. 10. More particularly, the n-p-n transistor 57 includes a base which is defined by the generally centrally located P-type region 52, an emitter defined by the N-type region 55, and a collector which is defined by the circumscribed portion 51 of the N-type material of the epitaxial layer 14. In addition, the p-n-p transistor 58 which is interconnected with the n-p-n transistor 57 includes a base which is common with the collector of transistor 57 and is defined by the circumscribed portion 51 of the epitaxial layer 14. The transistor 58 further includes an emitter which may be defined by the P-type region 53 or in certain instances may be defined by the P-type region 54, depending upon the characteristics desired and also includes a pair of collectors. A first collector is defined by the P-type isolation region 20 in accordance with a feature of the invention and is electrically connected by the conductor 56 to the N-type emitter as defined by the N-type region 55, while the second collector is in common with the base of n-p-n transistor 57 and hence is defined by the P-type region 52. The resultant interconnected transistor pair is functionally equivalent to a silicon controlled rectifier having an anode 60, a cathode 56, and a gate 62. This silicon controlled rectifier element has particularly desirable characteristics in that it is substantially completely electrically isolated from the underlying substate material 12 as well as being electrically isolated from regions of the N-type epitaxial layer which are external to the P-type isolation region 21. Accordingly, no current flow to the substrate can occur and the device is substantially completely free of parasitic action. This structure may also be interconnected to provide an isolated programmable unijunction transistor.

Other types of circuit elements and combinations thereof may be readily formed in accordance with the principles of the present invention utilizing the isolation region extending into the heavily doped interposed region for purposes of achieving substantially complete electrical isolation of the circuit element or elements with respects to the substrate in order to preclude the occurrence of undesired parasitic effects. In addition, since all of the various conductivity type regions terminates at a common face of the epitaxial layer, desired metallization patterns may be suitably provided for the interconnecting of various regions or for connecting the regions to other components, although for the sake of simplicity the metallization and itnerconnection patterns have not been illustrated in detail.

Illustrated in FIG. 12 is an electrical schematic diagram of a quad two-input NAND gate integrated circuit employing isolated circuit elements in accordance with the present invention. In particular, it is desirable for diodes 75, 76 and 77 to have, for example, a breakdown voltage greater than 15 volts and a current range of 30 MA peak and to be completely isolated from the substrate and from the other circuit elements of the integrated circuit such that there is no parasitic interaction between the diodes and the substrate or other circuit elements. Accordingly, diodes 75, 76 and 77 are provided in accordance with the present invention utilizing, for example, the diode structure of FIG. 3.

Several embodiments of the invention have now been described in detail. It is to be noted, however, that these descriptions of specific embodiments are merely illustrative of the principles underlying the inventive concept. It is contemplated that various modifications of the disclosed embodiments, as well as other embodiments of the invention, will, without departing from the spirit and scope of the invention, be apparent to persons skilled in the art.

What is claimed is:

1. A semiconductor structure comprising:

a body of monocrystalline semiconductor material including a substrate of one conductivity type and a layer of the opposite conductivity type disposed on said substrate and having an exposed surface, a heavily doped region of said opposite conductivity type buried within said body, said heavily doped region of said opposite conductivity type being interposed between a portion of said substrate and said layer, at least one region of said one conductivity type provided in said layer to define a P-N junction therewith, said at least one region being disposed in overlying relation to said heavily doped buried region and extending to the exposed surface of said layer, at least one isolation region of said one conductivity type provided in said layer and extending from the exposed surface thereof to said heavily doped buried region, said one isolation region being spaced from said substrate by said heavily doped buried region and having a closed geometrical configuration bounding an inner portion of said layer overlying said heavily doped buried region and separating said inner layer portion from an outer laterally adjoining layer portion, and said heavily doped buried region directly connecting said outer laterally adjoining layer portion to said inner layer portion to provide an electrical path of low resistivity of said opposite conductivity type therebetween.

2. A semiconductor structure as set forth in claim 1, wherein said heavily doped buried region respectively extends partially into said substrate and said layer.

3. A semiconductor structure as set forth in claim 1, further including a second isolation region of said one conductivity type provided in said layer and extending from the exposed surface thereof partially into said substrate, said second isolation region being spaced outwardly with respect to said at least one isolation region and said heavily doped buried region and having a closed geometrical configuration bounding said inner portion of said layer and said outer laterally adjoining layer portion separated therefrom by said one isolation region.

4. A semiconductor structure as set forth in claim 1, further including a second region of said one conductivity type provided in said layer to define a P-N junction therewith, said second region being disposed between said at least one region and said at least one isolation region in laterally spaced relationship with respect thereto and having a closed geometrical configuration, said second region of said one conductivity type overlying said heavily doped buried region and disposed in spaced relationship with respect thereto.

5. A semiconductor structure as set forth in claim 4, wherein said at least one isolation region extends partially into said heavily doped buried region along the entire extent of the closed geometrical configuration of said at least one isolation region.

6. A semiconductor structure as set forth in claim 5, further including a second heavily doped region of said opposite conductivity type, said second heavily doped region of said opposite conductivity type being provided in said layer and extending to the exposed surface thereof.

7. A semiconductor structure as set forth in claim 6, wherein said second heavily doped region of said opposite conductivity type is disposed in said layer inwardly with respect to said at least one isolation region of said one conductivity type.

8. A semiconductor structure as set forth in claim 7, wherein said second heavily doped region of said opposed conductivity type forms an ohmic contact enhancement zone, respective ohmic contacts provided on said one isolation region and said second heavily doped region of said opposite conductivity type, and a conductor extending between and connected to said ohmic contacts.

9. A conductivity structure as set forth in claim 1, wherein said at least one isolation region extends partially into said heavily doped buried region along the entire extent of the closed geometrical configuration of said at least one isolation region.

10. A semiconductor structure as set forth in claim 9, further including a second heavily doped region of said opposite conductivity type, said second heavily doped region of said opposite conductivity type being provided in said layer and extending to the exposed surface thereof.

11. A semiconductor structure as set forth in claim 10, wherein said second heavily doped region of said opposite conductivity type is disposed in said layer outwardly with respect to said at least one isolation region of said one conductivity type.

12. A semiconductor structure as set forth in claim 11, wherein said second heavily doped region of said opposite conductivity type forms an ohmic contact enhancement zone, respective ohmic contacts provided on said one isolation region and said second heavily doped region of said opposite conductivity type, and a conductor extending between and connected to said ohmic contacts.

13. A semiconductor structure as set forth in claim 12, wherein said at least one region of said one conductivity type provided in said layer extends partially into said heavily doped buried region of said opposite conductivity type.

14. A semiconductor structure as set forth in claim 12, further including another region of said opposite conductivity type provided in said at least one region of said one conductivity type to define a P-N junction therewith and extending to the exposed surface of said layer.

15. A semiconductor structure as set forth in claim 10, wherein said second heavily doped region of said opposite conductivity type is disposed in said layer inwardly with respect to said at least one isolation region of said one conductivity type.

16. A semiconductor structure as set forth in claim 15, wherein said second heavily doped region of said opposite conductivity type forms an ohmic contact enhancement zone, respective ohmic contacts provided on said one isolation region and said second heavily doped region of said opposite conductivity type, and a conductor extending between and connected to said ohmic contacts.

17. A semiconductor structure as set forth in claim 16, further including another region of said opposite conductivity type provided in said at least one region of said one conductivity type to define a P-N junction therewith and extending to the exposed surface of said layer.

18. A semiconductor structure as set forth in claim 9, further including an additional pair of regions of said one conductivity type provided in said layer and respectively extending to the exposed surface thereof, said additional pair of regions of said one conductivity type being disposed on opposite sides of said at least one region of said one conductivity type in spaced overlying relation to said heavily doped buried region and inwardly with respect to said at least one isolation region of said one conductivity type provided in said layer.

19. A semiconductor structure as set forth in claim 18, further including another region of said opposite conductivity type provided in said at least one region of said one conductivity type to define a P-N junction therewith and extending to the exposed surface of said layer.

20. A semiconductor structure as set forth in claim 19, further including respective contacts provided on said one isolation region and said another region of said opposite conductivity type, and a conductor extending between and connected to said contacts.

* * * * *